R. A. HEISING.
SYSTEM FOR THE TRANSMISSION OF INTELLIGENCE.
APPLICATION FILED JULY 16, 1918.
Reissued Oct. 26, 1920.
14,967.
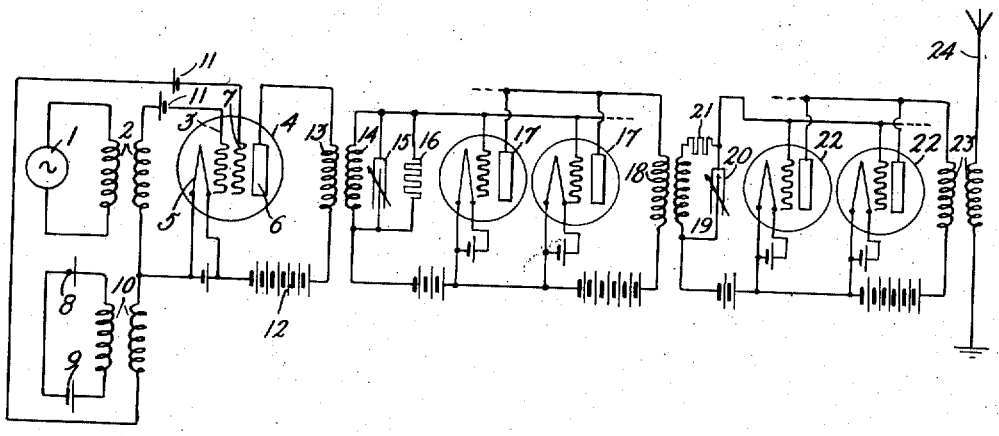
Inventor:
Raymond A. Heising
by P. E. Robinson Att'y

UNITED STATES PATENT OFFICE.

RAYMOND A. HEISING, OF EAST ORANGE, NEW JERSEY, ASSIGNOR, BY MESNE ASSIGNMENTS, TO AMERICAN TELEPHONE & TELEGRAPH COMPANY, A CORPORATION OF NEW YORK.

SYSTEM FOR THE TRANSMISSION OF INTELLIGENCE.

14,967. Specification of Reissued Letters Patent. Reissued Oct. 26, 1920.

Original No. 1,199,180, dated September 26, 1916, Serial No. 55,048, filed October 9, 1915. Application for reissue filed July 16, 1918. Serial No. 245,243.

*To all whom it may concern:*

Be it known that I, RAYMOND A. HEISING, a citizen of the United States, residing at East Orange, in the county of Essex and State of New Jersey, have invented certain new and useful Improvements in Systems for the Transmission of Intelligence, of which the following is a full, clear, concise, and exact description.

This invention relates to improvements in the art of transmitting signals by means of high frequency electric waves.

Its object is to provide means for modulating the amplitude of a high-frequency wave in accordance with the wave form of a low-frequency signal to be transmitted. This object is accomplished by impressing upon one part of the divided input circuit of a thermionic amplifier a high-frequency voltage, and upon the other part of said input circuit a voltage having the wave form of the signal to be transmitted. As a result of this, there appear in the output circuit of the amplifier, under proper conditions, amplified and modulated high frequency currents which may be used to supply power to an antenna or other circuit from which the signal is to be transmitted.

The possibility of so producing a modulated high-frequency current depends upon the fact that the amplifying power of the thermionic repeater depends upon, and increases with, the voltage impressed upon its input terminals. If, therefore, a variable voltage, corresponding to the signals to be sent, is impressed upon one part of the input circuit, and if the high-frequency alternating voltage is impressed upon another part, the high-frequency power appearing in the output circuit will vary in accordance with the low-frequency signal voltage. In thus applying these two voltages, it is essential, for good quality of transmission, that the change in amplification be produced by the signal voltage, so that the latter should preferably be larger or should be applied to be more effective than the high-frequency voltage. It has been found, however, that telephonic communication may be maintained even if the condition is violated, but the quality is then somewhat impaired.

The circuit arrangement which has been found by experiment to be most desirable is that shown in the drawing, which represents a preferred form of this invention.

In that drawing, 1 represents any suitable generator of high-frequency power. It need not have a large power capacity, since it is required to furnish but a small high-frequency voltage. By means of the transformer 2, the electromotive force developed by generator 1 is impressed upon one grid 3, of the divided input circuit of a thermionic amplifier 4, whose other elements are a heated cathode 5, an anode 6, and a second grid element 7.

8 represents a microphone, and 9 a battery by means of which it is supplied with direct current. The transformer 10, whose primary circuit contains the microphone, provides that a signal voltage produced in the microphone circuit shall be impressed upon the second input element 7 of the amplifier 4.

11, 11 are batteries whose objects are to insure that the electrodes 3 and 7 shall always be at negative potentials with respect to the filament 5. Under these circumstances no electrons can pass from the filament 5 to either input electrode, and therefore practically no current is taken by the input circuit.

12 is another battery which maintains the space current in the amplifier between anode 6 and cathode 5. The output circuit of this amplifier contains the coil 13, to which is coupled another coil 14, which, in combination with condenser 15, forms a tuned circuit whose frequency may be adjusted to that of the wave to be transmitted. The high non-inductive resistance 16 is preferably placed in shunt to the condenser 15, its object being to adjust the sharpness of tuning of the resonant circuit, and also to insure that the input circuits of the amplifiers, next to be described, shall offer a definite impedance to incoming waves.

The amplifiers 17 are arranged in parallel and have their input circuits connected across the terminals of the resonant circuit 14, 15, the common output circuit of these amplifiers including the coil 18. The object of these amplifiers is to produce, in the output circuit, a voltage considerably larger than that appearing over their input circuits, and it is not essential that the power output of this set shall be large. The resonant circuit 19, 20, also tuned to the frequency to be transmitted, is coupled to the coil 18. The input circuits of a number of amplifiers 22, arranged in parallel, are connected to the terminals of this second resonant circuit. The resistance 21 is added because it has been found to render more stable the operation of the amplifiers 22. These amplifiers are especially designed to produce in their output circuits high currents, rather than high effective alternating voltages, and therefore the combination of amplifiers 17 with amplifiers 22 serves to increase both the voltage and current components of the power appearing in the output circuit of the modulator element. In practice it has been found possible to employ as many as 500 amplifiers of the type 22. The common output circuit of amplifiers 22 is finally coupled, by means of transformer 23, to the radiating antenna 24. Any suitable receiving station may be used to receive the signals thus transmitted.

The operation of the modulating amplifier 4 is as follows: High-frequency voltages impressed upon the grid 3 from the generator 1 are, in the absence of an electromotive force due to microphone 8, simply repeated in enlarged form as variations of current in the output circuit. When, however, an electromotive force of the signal wave form is impressed upon the grid 7, the effect of the signaling voltage is to change the amplifying power of the repeater 4, and consequently to change also the amplitude of the high-frequency current variations in its output circuit. A modulated high-frequency current is therefor produced in the coil 13, and its effects are transmitted to antenna 24 by means of the intermediate apparatus, whose operation has already been described sufficiently in detail.

Although this invention is shown as applied to the transmission of radio signals, it is obvious that the mere substitution of a wire circuit, for example a telephone line, for the antenna 24, will permit the use of this system for the transmission of modulated high-frequency waves over wire lines, and I therefore desire to include that application as a part of my invention. It is also obvious that departures may be made from the particular circuit arrangement shown in the drawing.

What is claimed is:

1. An electron discharge device comprising an electron emitting element, an electron receiving element, and two impedance controlling elements for substantially independently varying the impedance presented to an electron stream between said electron emitting element and said electron receiving element.

2. An electron discharge device comprising an electron emitting element, an electron receiving element, two impedance controlling elements, and means for independently varying the potentials of said impedance controlling elements with respect to said electron emitting element to vary the impedance presented to the same electron stream.

3. An electron discharge device comprising a cathode, an anode, a plurality of electron discharge control elements, and means independent of the discharge device itself for producing and impressing different varying electromotive forces between the cathode and each of said respective control elements to vary the impedance presented to the same electron stream.

4. An electron discharge device having a cathode, an anode, means for varying at a high frequency rate, the impedance offered to an electron stream between said cathode and anode, and means substantially independent of said first named means for varying said impedance at a signaling frequency rate.

5. A modulator comprising an electron discharge device having a cathode, an anode, and two electron discharge control elements, an external source of high frequency waves, means for applying high frequency potential variations from said source to one of said control elements, and means for applying signaling frequency potential variations to the other of said control elements to vary the impedance presented to the same electron stream.

6. A modulator comprising an electron discharge device having an input circuit and an output circuit, means for impressing a high frequency electromotive force upon said input circuit, and means substantially independent of said input circuit for varying the impedance of said device in accordance with signals, whereby waves of said high frequency varying in amplitude in accordance with said signals are produced in said output circuit, and a transmission circuit connected to said output circuit for receiving therefrom and transmitting said signal modulated waves.

7. A modulator comprising an electron discharge device having an input circuit and an output circuit, means for impressing a high frequency electromotive force upon said input circuit, and means substantially independent of said input circuit and said output circuit for varying the impedance of said device in accordance with signals, whereby waves of said high frequency varying in amplitude in accordance with said signals are produced in said output circuit, and a transmission circuit connected to said output circuit for receiving therefrom and transmitting said signal modulated waves.

8. A modulator comprising an electron discharge device having an input circuit and an output circuit, means for impressing a high frequency electromotive force upon said input circuit, and means substantially independent of said input circuit for varying the impedance of said device in accordance with audio frequency variations, whereby waves of said high frequency varying in amplitude in accordance with said audio frequency variations are produced in said output circuit, and a transmission circuit connected to said output circuit for receiving therefrom and transmitting said modulated high frequency waves.

9. A modulator comprising an electron discharge device having an input circuit and an output circuit, means for impressing a high frequency electromotive force upon said input circuit, and means substantially independent of said input circuit for varying the impedance of said device in accordance with oscillations of a different frequency, whereby waves of said high frequency varying in amplitude in accordance with said different frequency oscillations are produced in said output circuit, and a transmission circuit connected to said output circuit for receiving therefrom and transmitting said modulated high frequency waves.

10. The combination in a radio transmission system, of an antenna, a source of high-frequency waves, a source of waves of signaling frequency, a thermionic repeater having an output circuit and a divided input circuit, the two parts of said input circuit being connected respectively to said sources of high-frequency waves and of low-frequency waves, of amplifying means whereby the modulated high-frequency waves in the output circuit of said repeater may be further increased in power, and a means for impressing such augmented power upon said antenna.

11. In a system for the transmission of signals by means of modulated high-frequency waves, a circuit, a thermionic amplifier having an output circuit, connected to said first mentioned circuit, and a divided input circuit; means electrically remote from said amplifier and its other circuits for impressing high-frequency electric oscillations upon one part of said divided circuit, and means for impressing impulses of signaling frequency upon the other part of said divided circuit.

12. In a system for the transmission of signals by means of modulated high-frequency waves, a circuit, a source of impulses of signaling frequency, a source of oscillations of high-frequency, and a thermionic amplifier having two grid elements, one of said elements being connected to said source of impulses, the other to said source of oscillations, and the output circuit of said amplifier being so connected as to transfer power to said first mentioned circuit.

13. A thermionic amplifier having an input circuit and an output circuit, means for impressing an alternating electromotive force upon said input circuit, and means substantially independent of said input circuit for varying the amplifying power of said amplifier in accordance with signal variations.

14. A thermionic amplifier having an output circuit and two input circuits, external means for producing and impressing a varying electro-motive force upon one of said input circuits, and means associated with the other of said input circuits for varying the amplifying power of said amplifier in accordance with signals.

15. The method of modulation which comprises subjecting an electron stream to the action of two variable impedances, each of which has a magnitude independent of that of said electron stream, one of which impedances varies cyclically and the other of which varies in accordance with signals.

16. The method of operating an electron discharge device comprising a cathode, an anode, and two grids, which consists in impeding the same electron strain by applying radio frequency potential variations to one of the grids and audio frequency potential variations to the other, said potential variations being independent of each other.

17. The method of operating an electron discharge device comprising subjecting a single electron stream to the action of a plurality of variable impedances each of which has a magnitude substantially independent of said electron stream and each of which varies in accordance with an alternating electromotive force individual thereto.

18. The method of operating an electron discharge device comprising subjecting a single electron stream to the action of a plurality of substantially independent impedances and causing said impedances to vary independently of each other.

19. The combination with an amplifier having the property of variably amplifying in accordance with the energy impressed thereon, of means for simultaneously independently impressing high frequency waves and low frequency waves upon said amplifier, the amplitude of said high frequency waves being less than the amplitude of said low frequency waves.

20. In combination, a discharge device having a cathode and an anode, a source of current for producing an electric discharge stream between said cathode and anode, and a plurality of variable impedance elements so associated with said device as to present substantially independently varying impedances to said stream between said cathode and said anode.

21. In combination, an electron discharge device having an output circuit, a second electron discharge device having an input circuit, a transformer connecting said circuits, a capacity element forming a tuned circuit with the secondary winding of said transformer, and a resistance in shunt to said capacity element.

22. In combination, an electron discharge device having an output circuit, a second electron discharge device having an input circuit, means comprising an inductance associating said circuits, and a capacity element and a resistance element in parallel thereto and forming a tuned circuit therewith.

23. In combination an electron discharge device having an output circuit, a second electron discharge device having an input circuit, said circuits being coupled by a transformer, a capacity element forming a tuned circuit with one winding of said transformer, and means comprising a resistance in shunt to said capacity element connected thereto to adjust the sharpness of tuning of said circuit.

24. In combination an electron discharge device having an output circuit, a second electron discharge device having an input circuit, and means comprising a transformer for coupling said circuits, said transformer having one winding shunted by a capacity element and by a resistance element.

25. A modulator comprising a discharge device having a cathode and an anode, a source of current for producing an electric discharge stream between said cathode and anode, and a plurality of variable impedance elements so associated with said device as to present substantially independently varying impedances to said stream between said cathode and said anode.

In witness whereof, I hereunto subscribe my name this 1st day of July, 1918.

RAYMOND A. HEISING.